United States Patent [19]
Yamaguchi et al.

[11] Patent Number: 5,270,577
[45] Date of Patent: Dec. 14, 1993

[54] INPUT MODULE

[75] Inventors: Yutaka Yamaguchi; Toshihide Iinuma, both of Tokyo, Japan

[73] Assignees: Toshiba Kikai Kabushiki Kaisha, Tokyo; Shibaki Controls, Inc., Numazu, both of Japan

[21] Appl. No.: 592,373

[22] Filed: Oct. 3, 1990

[30] Foreign Application Priority Data

Jan. 23, 1990 [JP] Japan .................... 2-12911

[51] Int. Cl.$^5$ .............................. H02J 3/10
[52] U.S. Cl. ............................ 307/26; 307/25
[58] Field of Search ........... 307/205, 206, 207, 311, 307/603, 608, 22–26, 56, 72, 75, 173; 323/273

[56] References Cited

U.S. PATENT DOCUMENTS

| | | | |
|---|---|---|---|
| 3,535,609 | 10/1970 | Soroka | 323/273 |
| 3,898,474 | 8/1975 | Funatsu et al. | 307/75 X |
| 4,275,307 | 6/1981 | Struger et al. | 250/551 |
| 4,608,498 | 8/1986 | Falzarano et al. | 307/72 X |

OTHER PUBLICATIONS

Silicon Zoner Diode Handbook, Motorola Inc, 1961, Second Edition; p. 45.

*Primary Examiner*—A. D. Pellinen
*Assistant Examiner*—Michael A. Friedhofer
*Attorney, Agent, or Firm*—Cushman, Darby & Cushman

[57] ABSTRACT

An input module used in a factory automation apparatus, which is constituted by a bidirectional conduction circuit for connecting to an AC power source or DC power source with both plus or minus common line, a constant current circuit for supplying constant current, and a load circuit accepting the constant current. When the voltage range is less wide, a bidirectional conduction circuit and a filter circuit are used.

8 Claims, 8 Drawing Sheets

INPUT MODULE

BACKGROUND OF THE INVENTION

1. Field of the Invention

This invention relates to a circuit for use in a factory automation apparatus, for example, a numerical control apparatus, a programmable controller, a robot controller and the like.

More specifically, this invention relates to an input module of the factory automation apparatus, which is used to input binary information into the apparatus.

2. Description of the Related Art

Signals from push button switches, limit switches, and the like are ON/OFF signals and may be called "binary information." This binary information can be used in numerical control apparatus, programmable controllers and robot controllers, and the like, in order to input these ON/OFF binary information to perform various kinds of control. Input circuits of these apparatus are constructed on a single printed circuit board or in a module circuit like a large scale integration circuit and are called input modules.

In the related art, there have been three kinds of input modules because of the different power sources used for generating the binary signals.

These are "input module for DC with plus common", "input module for DC with minus common", and "input module for AC".

The related art of input modules are shown in FIG. 11 and FIG. 12.

FIG. 11 shows an example of an input module circuit used in a circuit which uses DC 24V as the power source of an input signal. The voltage of power source 100 is switched ON/OFF by switch 102 and divided by the divider circuit that includes resistor 103 and resistor 104.

The divided voltage becomes a suitable voltage for a binary signal and is applied to light emitting diode 105a of photo coupler 105. When the light emitted by the ON/OFF signal of light emitting diode 105a reaches the photo transistor 105b in photo coupler 105, it causes photo transistor 105 to turn ON/OFF. Then the binary information of photo transistor 105b is sent to an internal circuit of an associated apparatus, for instance, to the programmable controller. The circuit of FIG. 11 is an example of a minus common type circuit in which the minus pole of power source 101 is a common line. If the polarity of photo diode 105a in photo coupler 105 is reversed, power source 101' having a common line of the plus pole is applicable.

The other example of an input module is shown in FIG. 12, in which an AC 100V power source is used. This example is different from FIG. 11 in that there is a dividing circuit using an impedance of capacitor 107, and bidirectional photo coupler 108 is used instead of unidirectional photo coupler 105. Since the rest of this circuit is identical to and operates in the same manner as in the circuit in FIG. 11, a detailed description is believed unnecessary. As described above, the related art input module includes an AC power source, a voltage dividing circuit and a bidirectional photo coupler for an AC input signal, and also includes a DC power source and an unidirectional or bidirectional power source for a DC input signal.

Therefore, in the related art, the electrical parts are different depending on kind of the power source which is used in the control apparatus. Thus, it is requested that special type of input modules are prepared in response to the power source which is used.

Thus, manufacturers of input modules must make and prepare various kinds of input modules for different demands of users. This results in complexity in the production line, complexity in the process control, and a problem of a large amount of storage space.

Further, OEM manufacturers must use input modules properly, test them, and confirm various kinds of input modules. This also results in complexity of manufacturing and quality control.

Furthermore, end users must also keep many kinds of input modules. This is also inconvenient.

Accordingly, it has been desirable to provide an input module which is able to deal with various kinds of power sources by preparing only one kind of input module.

SUMMARY OF THE INVENTION

It is an object of the present invention to provide an input module which is able to deal with various kinds of power sources.

According to the present invention, there is provided an input module used in a control apparatus having an AC power source and a DC power source for inputting binary information from a switching source, comprising conduction means bidirectionally conducting the binary information of the switching means, and being connectable to both the AC power source and the DC power source; constant current means for the output from the conduction means for the output from the conduction means and supplying constant current; and load means for accepting the constant current from the constant current means and internally outputting the binary information into the control apparatus.

BRIEF DESCRIPTION OF THE DRAWINGS

The invention can be fully understood by reference to the accompanying drawings in which.

DESCRIPTION OF THE PREFERRED EMBODIMENTS

The preferred embodiments of the present invention will now be described in more detail with reference to the accompanying drawings.

Figure 1:
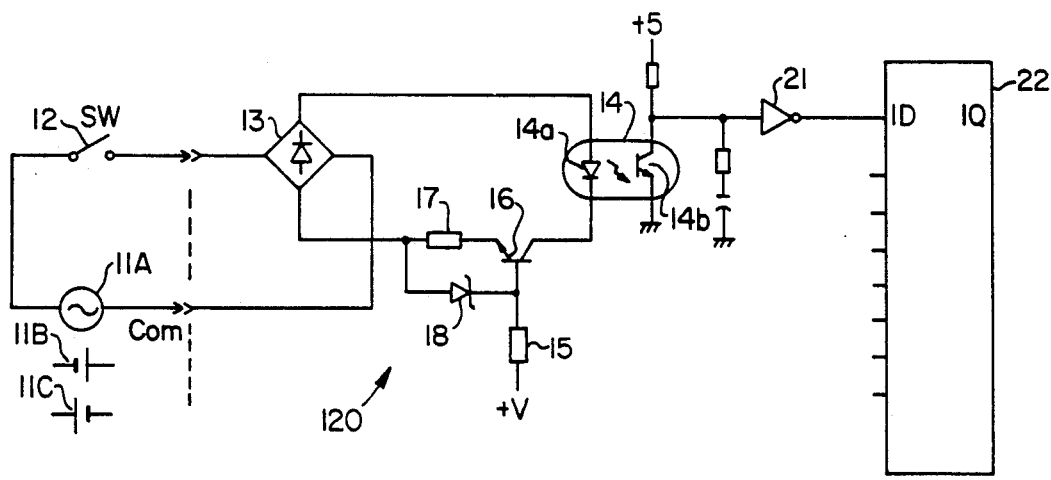
FIG. 1 is a circuit diagram showing the first embodiment of the present invention.

The circuit diagram of the first embodiment for the present invention is shown in FIG. 1.

FIG. 1 shows an embodiment which includes a rectification circuit 13, a constant current circuit 120, and an isolation circuit 14. As shown in the figure, any one of AC power source 11A, DC power source 11B having plus common line, or DC power source 11C having minus common line could be used as a power source for an input signal which acts as a signal source. A case to which AC power source 11A is applied will be described.

Switch 12 is a signal source and is connected to AC power source 11A. The signal which is generated by switch 12 is input to full Wave rectification circuit 13. A constant current circuit 120 and light emitting diode 14a of photo coupler 14 are connected in series at the output of rectification circuit 13.

The constant current circuit 120 includes resistor 15, resistor 17, zener diode 18 and transistor 16. DC power supply +V is applied to the base of transistor 16 through resistor 15 and the collector of transistor 16 is connected to the cathode of light emitting diode 14a. The emitter of transistor 16 is connected to a terminal of output of full wave rectification circuit 13 through resistor 17. The output terminal of full wave rectification circuit 13 is connected to the anode of zener diode 18, and the cathode of zener diode 18 is connected to the base of transistor 16.

The voltage value of zener diode 18 may be, for instance, when base-emitter voltage of transistor 16 is 0.6V, selected to 5.6V. The voltage developed across resistor 17, which is caused by the emitter current of transistor 16, is then kept to zener voltage minus 0.6V=5V. Thus, the electric current from emitter, which has constant voltage across it, to collector of transistor 16 is regulated by this resistor which has a constant voltage across it and remains constant.

The collector of photo-transistor 14b in photo coupler 14 is connected to a +5V power supply to produce a control signal. The control signal is used, for example, as input signal 1D of latch circuit 22 via inverter driver 21. An LSI having a plurality of circuits is normally used for such a latch circuit. In the embodiment, an LSI, which has eight latch circuits, is shown. The mark 1D means the first data input of the LSI and the mark 1Q means the first output which depends on the 1D input.

The embodiments hereinafter show only one latch circuit of similar construction, while it is normal for eight circuits of similar construction to be prepared. Thus, any number of circuits could be prepared if it is needed.

The operation of the embodiment is described next. A signal generated by switch 12, which is connected to AC power source 11A, is rectified by full wave rectification circuit 13 and becomes a DC ON/OFF signal. The DC ON/OFF signal is supplied to light emitting diode 14a in photo-coupler 14 and an output signal is generated from photo-transistor 14b.

Since, as described, the input signal is rectified first by rectification circuit 13, a DC power source could be used as the power source of the input signal regardless of polarity. If the voltage specification of the rectification circuit 13 is selected to be a wide range, the circuit is applicable to not only a wide range of AC and DC power sources but also to any polarity DC power source. Thus, the circuit could be used as a general purpose input circuit.

Further, the output signal to the internal circuit of a control apparatus is insulated electrically from the input signal. This is also favorable to construct a control system.

Figure 2:
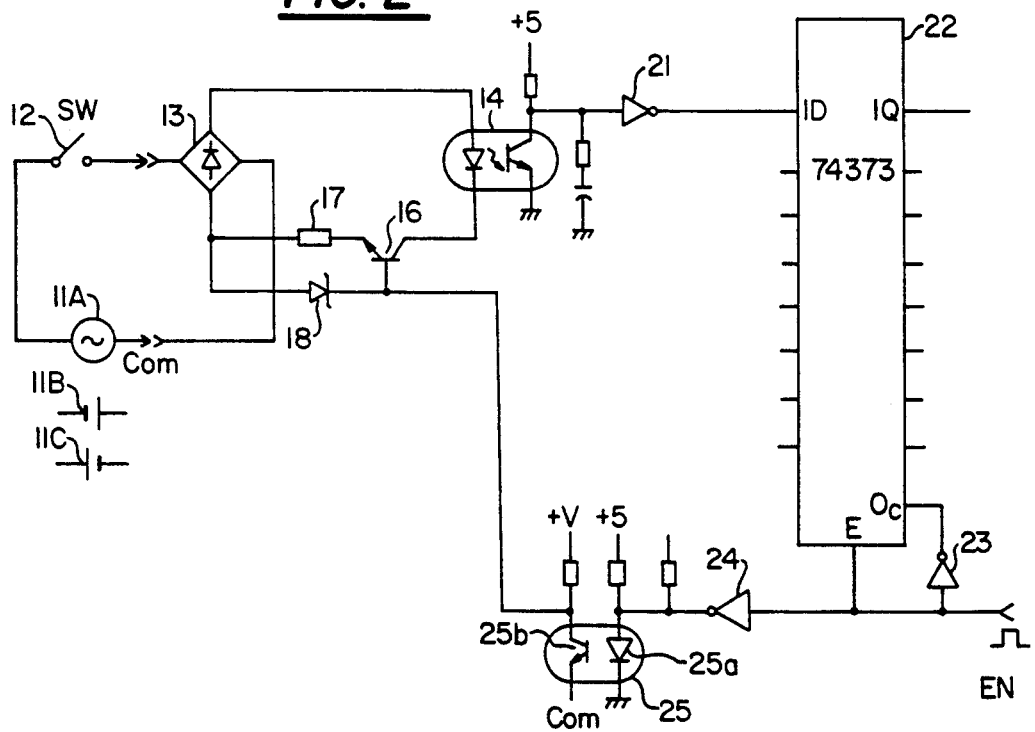
FIG. 2 is a circuit diagram showing the second embodiment of the present invention.

The circuit of the second embodiment of the present invention is shown in FIG. 2. In the figure, the same numerals are put on the same parts as those of FIG. 1, so that a detailed description in believed unnecessary.

The basic constitution of the second embodiment is similar to the first embodiment, but the second embodiment also uses an enable signal EN, which is applied to transistor 16 of the constant current circuit in response to the internal control signal of the control apparatus. The enable signal EN is input to the terminal E of latch circuit 22 and to input Oc via inverter 23. The enable signal is inverted by inverter 24, and applied to the anode of diode 25a in photo-coupler 25. DC power supply +5V is also supplied at the anode so that the electric current does not flow through the light emitting diode in photo-coupler 25 when the output of inverter 24 is high, and light is not emitted. On the other hand, the collector of photo transistor 25b is connected to another power supply +V via a resistor. When light emitting diode does not light, photo-transistor 25b also does not conduct. Accordingly, voltage from another power supply +V is applied to the base of transistor 16. When the enable signal is generated, the transistor 25b turns on, and the transistor 16 is operated during the period of the enable signal. This prevents the overheating of transistor 16 and also results in a reduction of power consumption.

Figure 3:
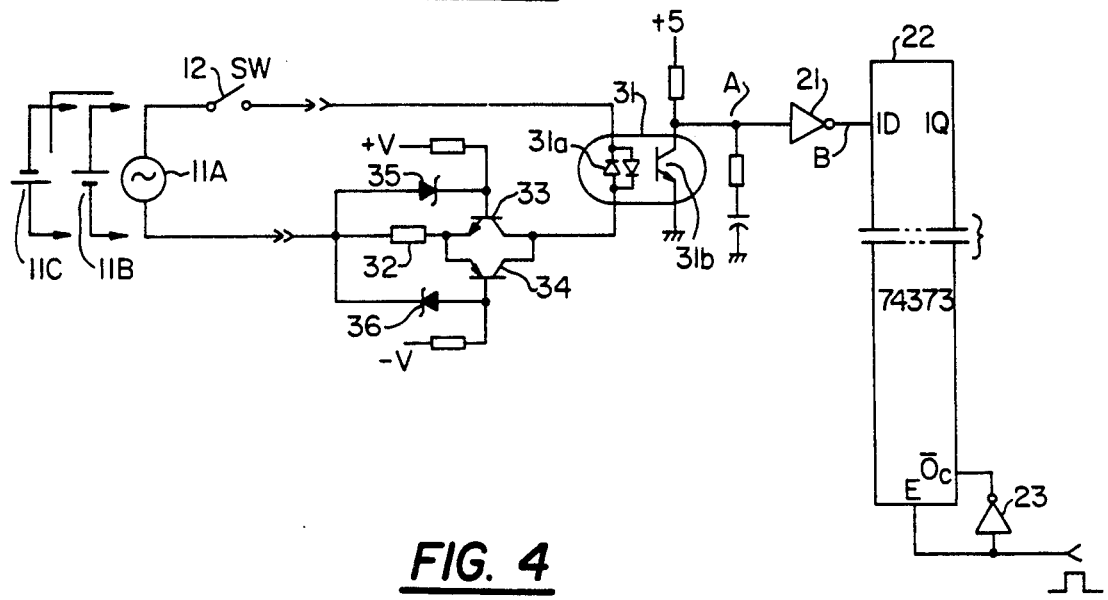
FIG. 3 is a circuit diagram showing the third embodiment of the present invention.

The circuit of the third embodiment of the present invention is illustrated in FIG. 3.

In this embodiment a bidirectional constant current circuit is provided instead of the rectification circuit and the constant current circuit of FIG. 1 or FIG. 2. The bidirectional constant current circuit is constituted by two transistors, 33 and 34, and two zener diodes, 35 and 36. Also, the third embodiment is different from the first and the second embodiment in use of the bidirectional photo coupler instead of unidirectional photo coupler.

The bidirectional constant current circuit includes NPN transistor 33, PNP transistor 34, zener diode 35, zener diode 36, and resistor 32. NPN transistor 33 and PNP transistor 34 are connected in parallel at their emitters and collectors and the emitters are also connected to resistor 32. The other end of resistor 32 is connected to both cathodes of zener diode 35 and zener diode 36. This connection point of zener diodes and resistor 32 is connected to the common line of the power source 11A. The base of transistor 33 is connected to the cathode of zener diode 35 and also connected to the power supply +V through a resistor. The base of transistor 34 is connected to the anode of zener diode 36 and connected to the power supply −V through another resistor. The connection point of collectors of both PNP and NPN transistors 33 and 34 are connected to one of the terminals of photo-diodes 31a in photo-coupler 31. Another terminal of photo diodes 31a in photo coupler 31 is connected to switch 12, which is a signal source for the input circuit.

The operation of the embodiment will be described with reference to FIG. 4.

Figure 4:
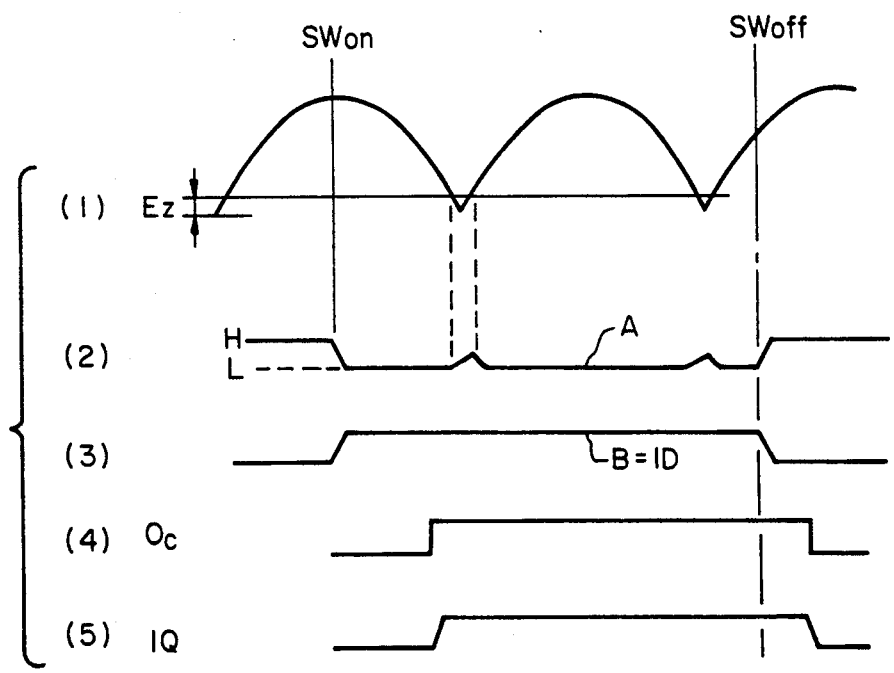
FIG. 4 is a timing chart of the circuit motion in FIG. 3.

The voltage wave form developed through photodiodes 31a in photo-coupler 31 is shown in (1) of FIG. 4. Since photo diode 31a is bidirectional, the absolute value of the wave form is shown.

When switch 12 is turned on and then turned off, photo diodes 31a emit light during the on time. During the on time, the output signal at the collector of transistor 31 (node A) becomes the wave form shown in (2) of FIG. 4, and level L of the wave form remains constant. When the voltage of the power source is lower than the zener voltage, the voltage of node A rises briefly. If the zener voltage is selected low enough, the signal of node A becomes stable. The signal is connected to inverter 21 and the output signal becomes clear, as shown in (3) of FIG. 4 at output point B and the signal has no ripple component. The signal is connected to D input in latch circuit 22. (4) of FIG. 4 shows a wave form of output control input signal OC and (5) of FIG. 4 shows the resultant Q output signal of latch 22. This shows the manner of input signal of switch 12 to the control apparatus.

Figure 5:
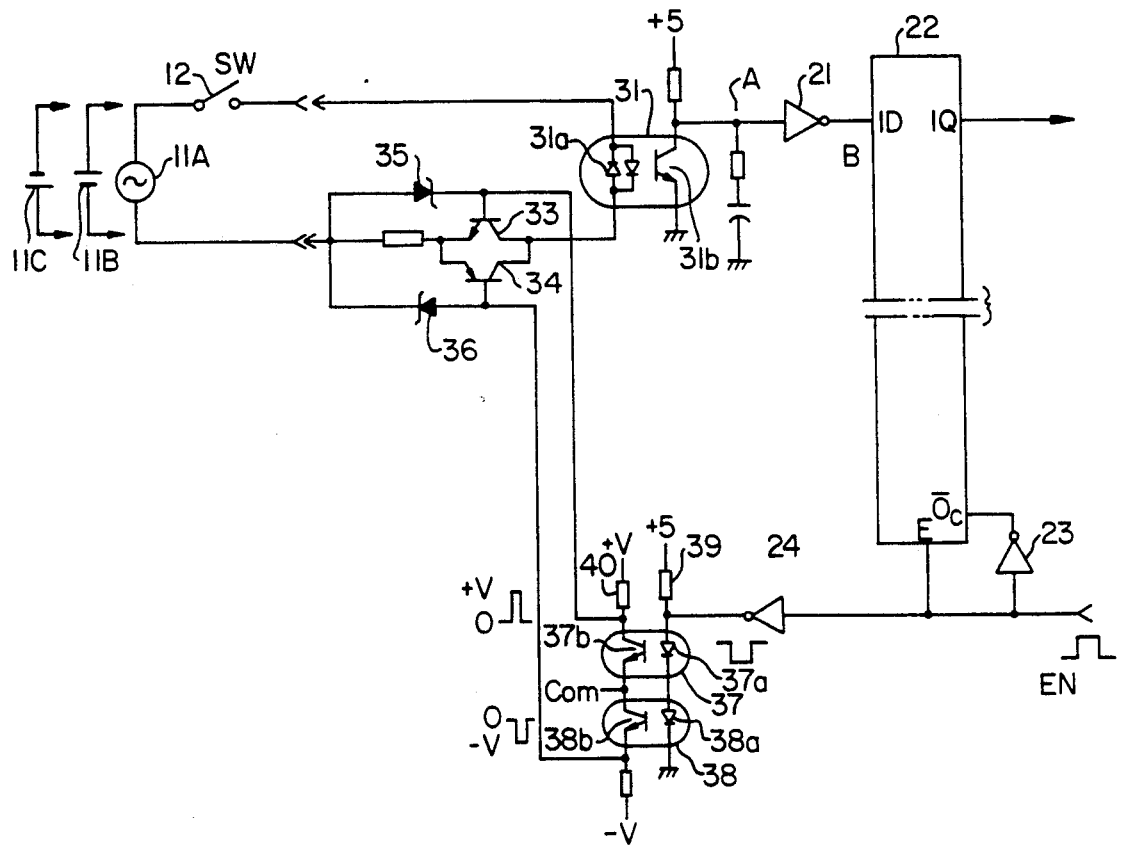
FIG. 5 is a circuit diagram showing the fourth embodiment of the present invention.

The fourth embodiment of the present invention is shown in FIG. 5. The embodiment adds an overheating reduction circuit for transistors to the third embodiment as described in the second embodiment. That is, enable signal EN supplying point for two photo diodes 37 and 38. While enable signal EN is ON, these photo diodes do not emit light.

On the other hand, power supply +V is applied to the collector of photo transistor 37b and to the base of transistor 33. Power supply −V is applied to the emitter of transistor 38b, which is also connected in series to photo transistor 37b. Accordingly, when photo diode 37a and photo diode 38a emit light, photo transistor 37b and photo transistor 38b are both turned on, and the enable signal does not reach either transistor 33 or transistor 34. When photo diode 37a and photo diode 38a do not emit light, the enable signal reaches both transistor 33 and 34. This results in a reduction in heating for both transistor 33 and transistor 34.

Figure 6:
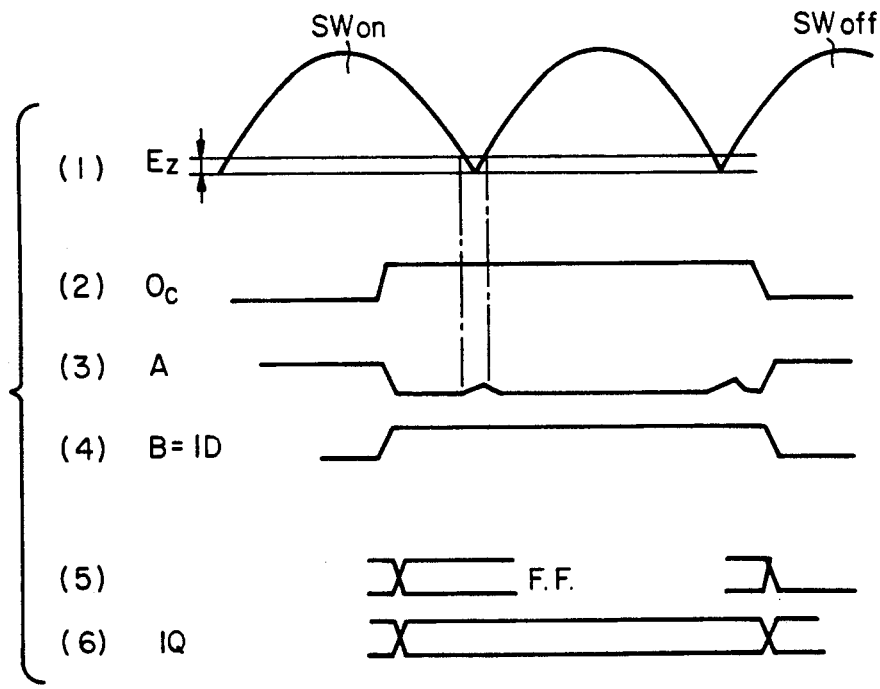
FIG. 6 is a timing chart of the circuit motion in FIG. 5.

The wave form chart of the operation of the fourth embodiment is shown in FIG. 6.

In the figures, (1) of FIG. 6 through (4) of FIG. 6 are identical to that of FIG. 4, so detailed description is believed unnecessary. (5) and (6) of FIG. 6 show the operation of FLIP/FLOP in the ON status of switch 12. When the output control input is "H" level, output 1Q is generated.

Figure 7:
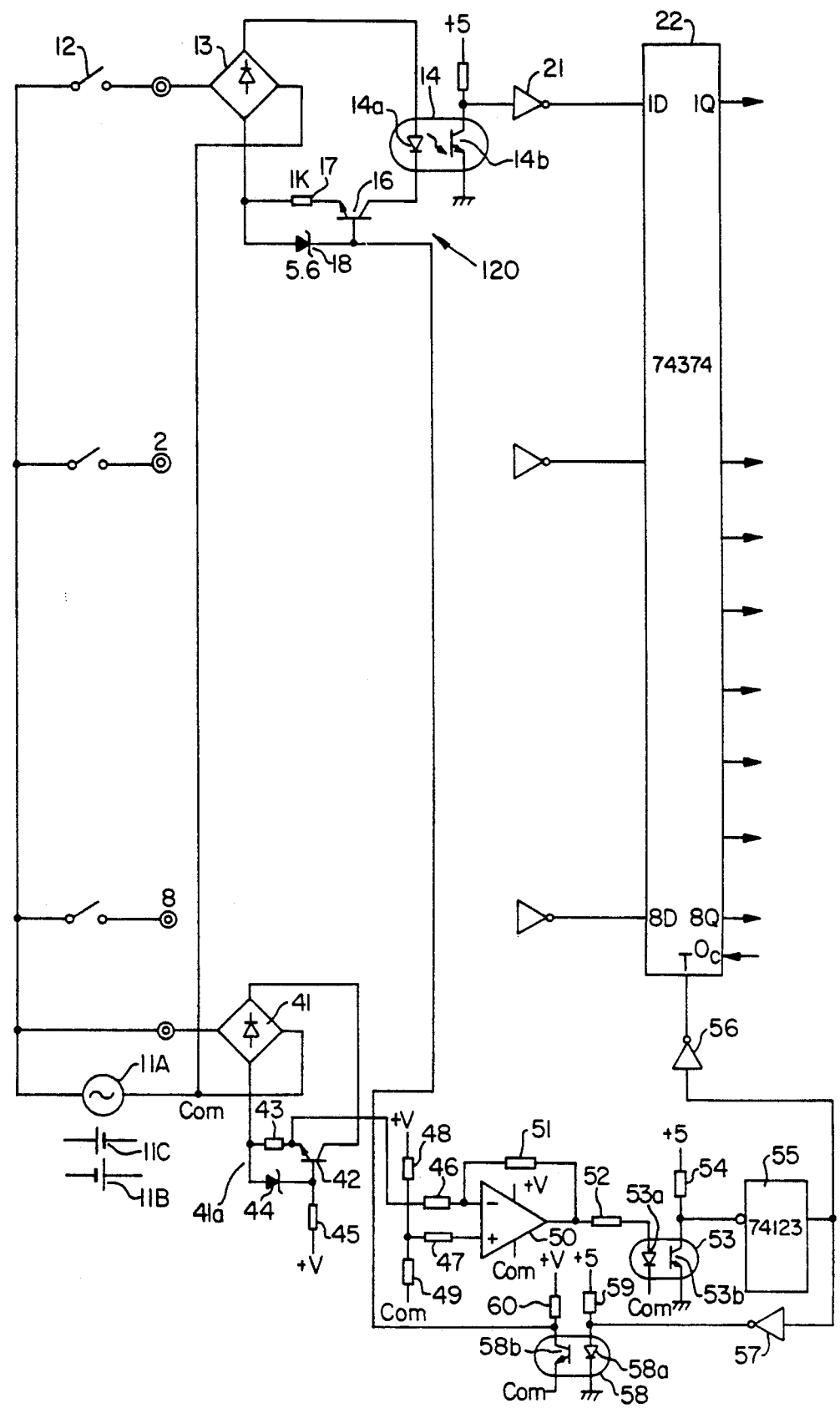
FIG. 7 is a circuit diagram showing the fifth embodiment of the present invention.

The circuit of the fifth embodiment is shown in FIG. 7. This embodiment has an error prevention circuit for use when an AC power source is used for power source of input signals. This means preparation of another circuit which is different from the circuit of input signal formation. This error prevention circuit detects the rising edge of the AC signal and the output from the circuit controls the constant current circuit.

The embodiment includes a second full wave rectification circuit 41 which is another circuit and is different from full wave rectification circuit 13 for input signal formation. AC power source is applied to second full wave rectification 41 and the output signal from second full wave rectification circuit 41 is fed to another constant current circuit 41a. The constant current circuit 41a includes NPN transistor 42, resistor 43, resistor 45 and zener diode 44. The constitution of the constant current circuit is similar to the constant current circuit 120 for the input signal formation. The output from the constant current circuit 41a is taken from the emitter of transistor 42 and connected to the inverting input terminal of comparator 50. A divided voltage from power supply +V by resistor 48 and resistor 49 is applied through resistor 47 to the positive input terminal of comparator 50. The output of comparator 50 is fed back via resistor 51 and connected to light emitting diode 53a in photo-coupler 53. The emitter of photo-transistor 53b is grounded. The collector of photo-transistor 53b is connected to power supply +5V through resistor 54 and also connected to the inverting input of mono-stable multivibrator 55. The output signal from mono-stable multivibrator 55 is fed to clock input terminal T of latch circuit 22 through inverter 56. Also, the output signal is inverted by inverter 57 and is fed to the anode of light emitting diode 58 in photo-coupler 58. Power supply +5V is supplied through resistor 59 to this anode. Further, the emitter of photo-transistor 58b is connected to the common line, and the collector of photo-transistor 58b is connected to power supply +V through resistor 60. The output signal from the collector is input to the base of transistor 16 in the constant current circuit. These elements having numeral 41 through numeral 60 constitute a synchronous signal generation circuit.

In operation of the synchronous signal generation circuit, the voltage of the constant current circuit, which is generated by circuit elements 42-45 is compared to the voltage generated from power supply +V in comparator 50. When the voltage from the power supply +V is higher than that of the constant current circuit 41a, light emitting diode 53a lights, and photo transistor 53 conducts, so that a high level signal is generated from monostable multi-vibrator 55. The high level signal from mono-stable multi-vibrator 55 shows that the AC power source is rising and the inverted signal by inverter 56 enables latch circuit 22. The inverted signal by inverter 57 makes photo diode 58a turn off, and also makes photo transistor 58b cut off, so that the signal sent to the base of transistor 16 is activated.

As above described, in this embodiment, a synchronous circuit is utilized to input proper signals at proper timing with respect to one another. A comparator 50 is used in this embodiment and an output signal controls a data input operation. When the level of the input signals is lower than the level of a DC power supply, the data input operation is not operated.

Figure 8:
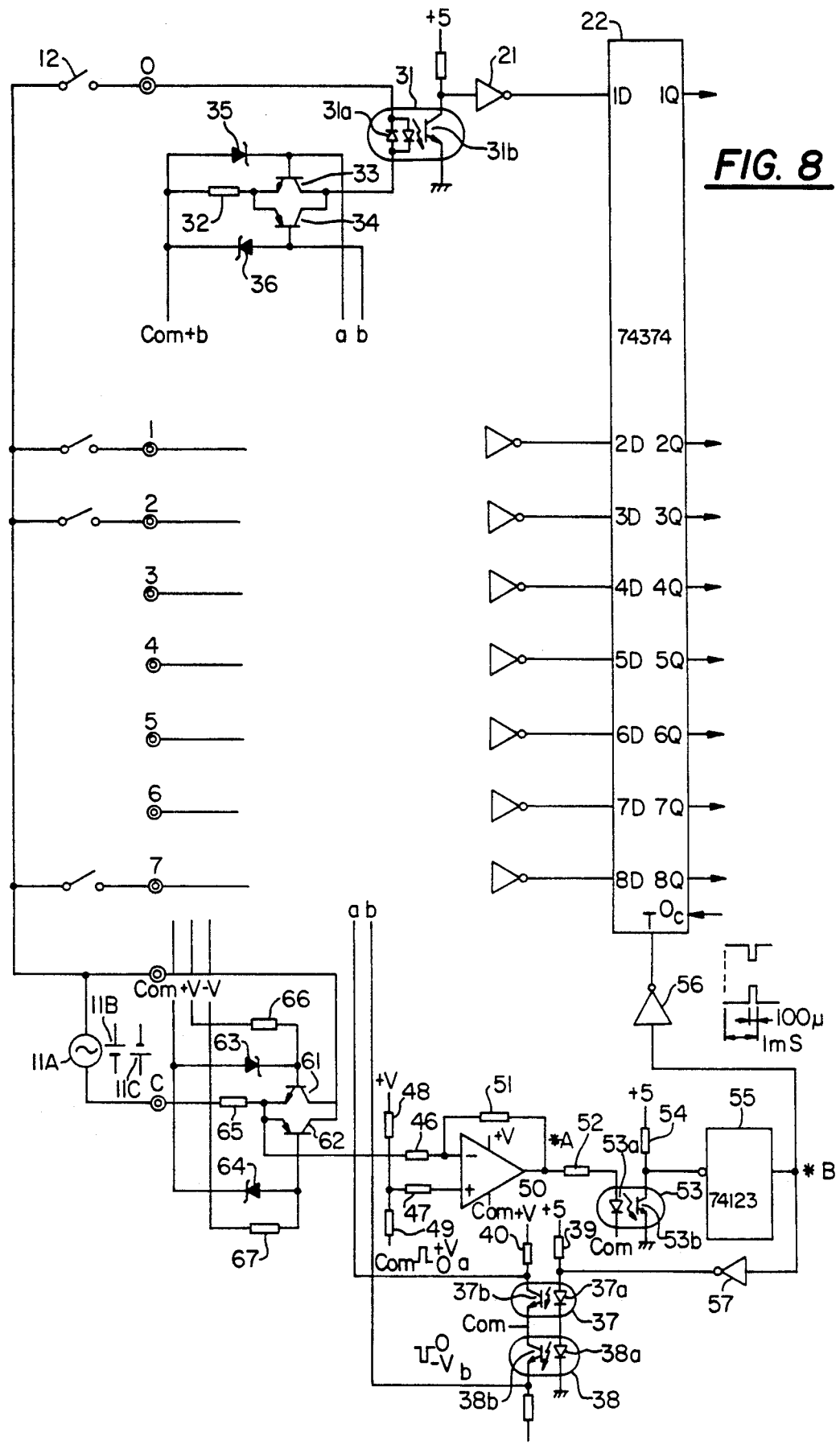
FIG. 8 is a circuit diagram showing the sixth embodiment of the present invention.

The circuit of the sixth embodiment of the present invention is shown in FIG. 8. This embodiment is identical to the embodiment of FIG. 5, while it has a synchronous circuit as similar to the synchronous circuit shown in FIG. 7.

This embodiment is constituted by circuit elements having numerals 61 through 65, which are similar to the circuit elements having numerals 32 through 36. Since these elements are constituted and connected in a same manner, a detailed description is believed unnecessary.

Figure 9:
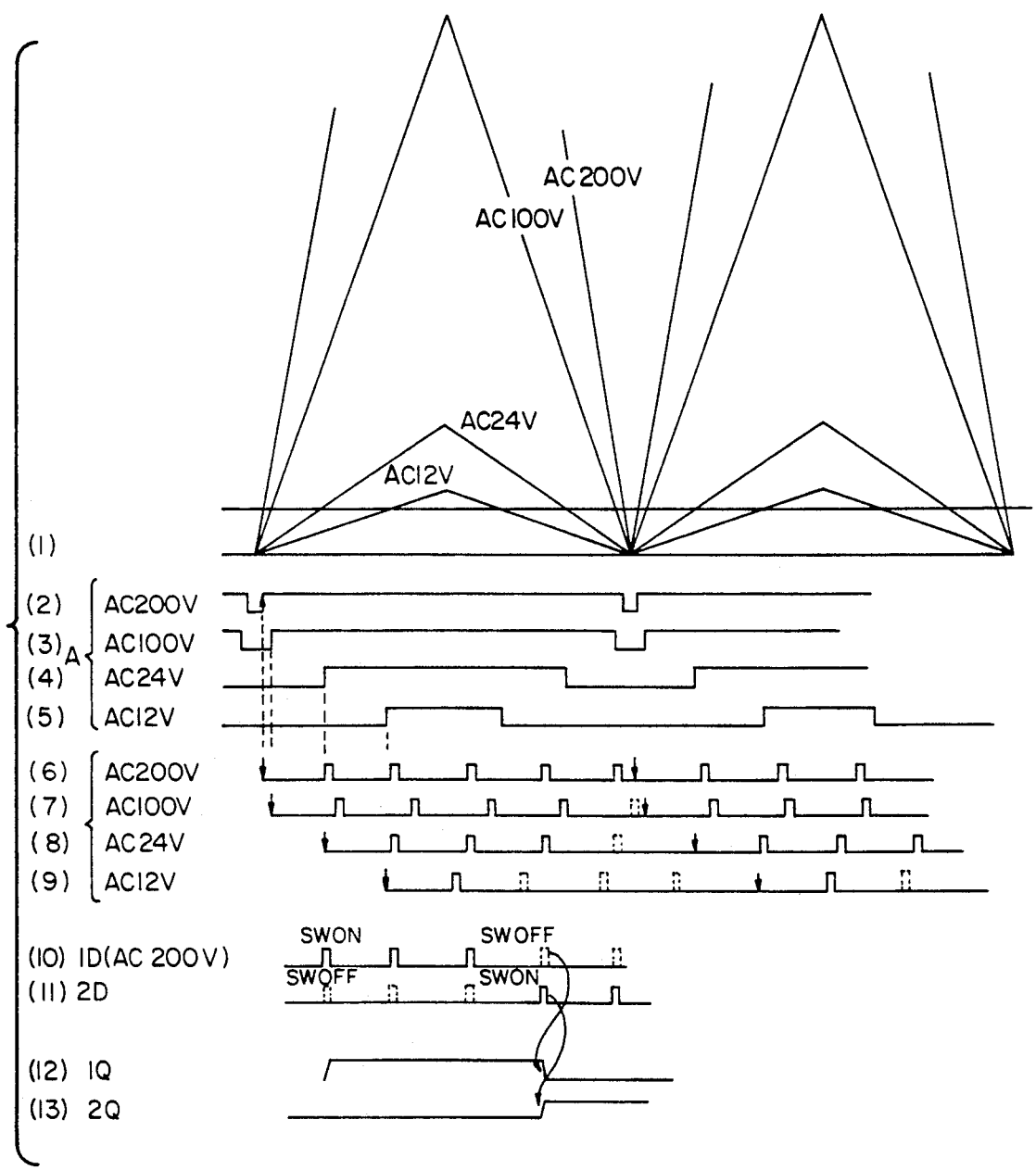
FIG. 9 is a timing chart of the embodiment in FIG. 8.
Figure 10:
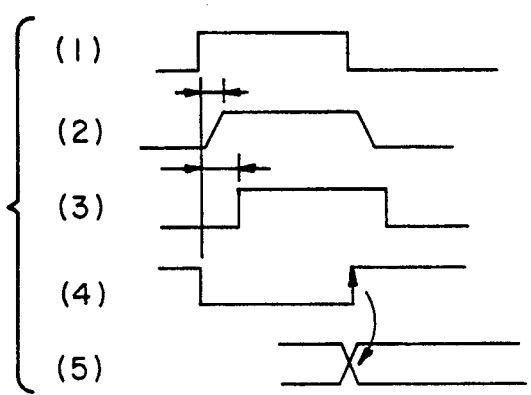
FIG. 10 is a timing chart of the embodiment in FIG. 9.
Figure 11:
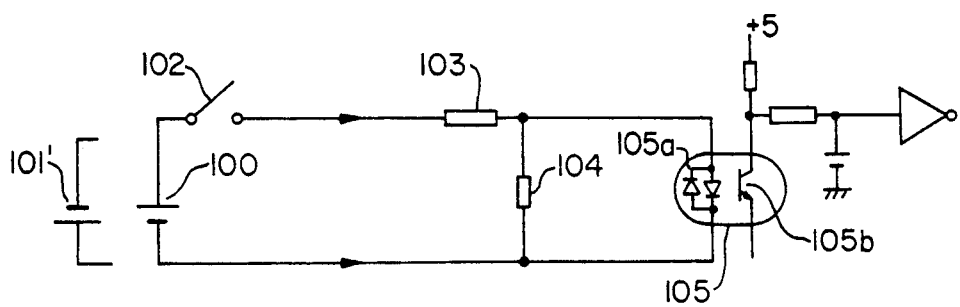
FIG. 11 is a circuit diagram of an input module showing a related art.
Figure 12:
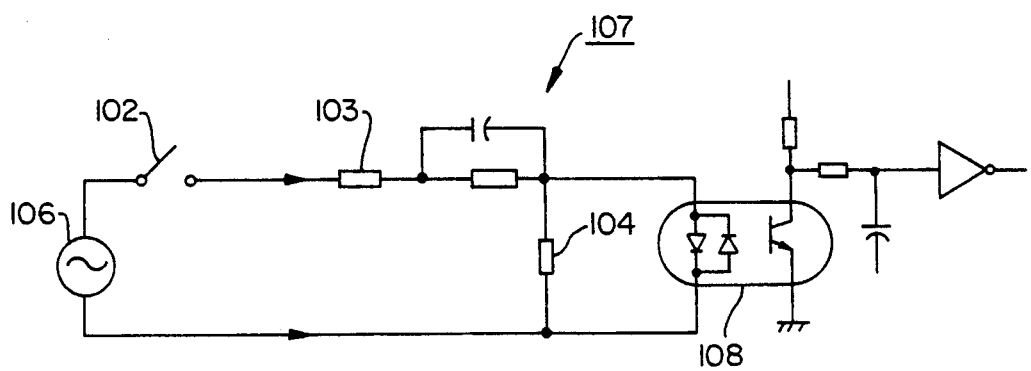
FIG. 12 is a circuit diagram of an input module showing another related art.

Timing charts for the circuit of FIG. 8 are shown in FIG. 9 and FIG. 10.

The manner in which voltages of various AC power sources rise higher than the setting value of the comparator 50 circuit is shown in (I) of FIGURE 9. When the voltage of AC power source goes over the setting value, the output of comparator 50 is inverted.

(2) through (5) of FIG. 9 show the output of comparator 50 for different voltages respectively. The figure shows that higher voltages make pulses that are longer in time.

(6) through (9) of FIG. 9 show the output signal from mono-stable multi-vibrator 55. The signal appears at the leading edge of the output signal, as shown with arrows. In the case of AC 200V, if input D of latch circuit 22 is shown as (10) of FIG. 9, output Q appears as (12) of FIG. 9. In the same manner, if input D of second latch circuit is shown as (11) of FIG. 9, output Q appears as (13) of FIG. 9.

(1) of FIG. 10 shows the output signal of mono-stable multi=vibrator 55 and (2) of FIG. 10 shows the output signal of photo-coupler 37. (3) of FIG. 10 shows input D of latch circuit 22 and (4) of FIG. 10 shows input T of latch circuit 22. Also, (5) of FIG. 5 shows output Q of latch circuit 22.

As shown in FIG. 9, latch circuits are prepared by the rising of power source which is used generally to input signals and then input signals to D inputs are applied. Thus, this can realize stable motion for inputting binary information.

Although in this embodiment described above, a full wave rectification or a circuit of two transistors is used as a bidirectional conduction circuit, other means may be used, if it has the same function.

Figure 13:
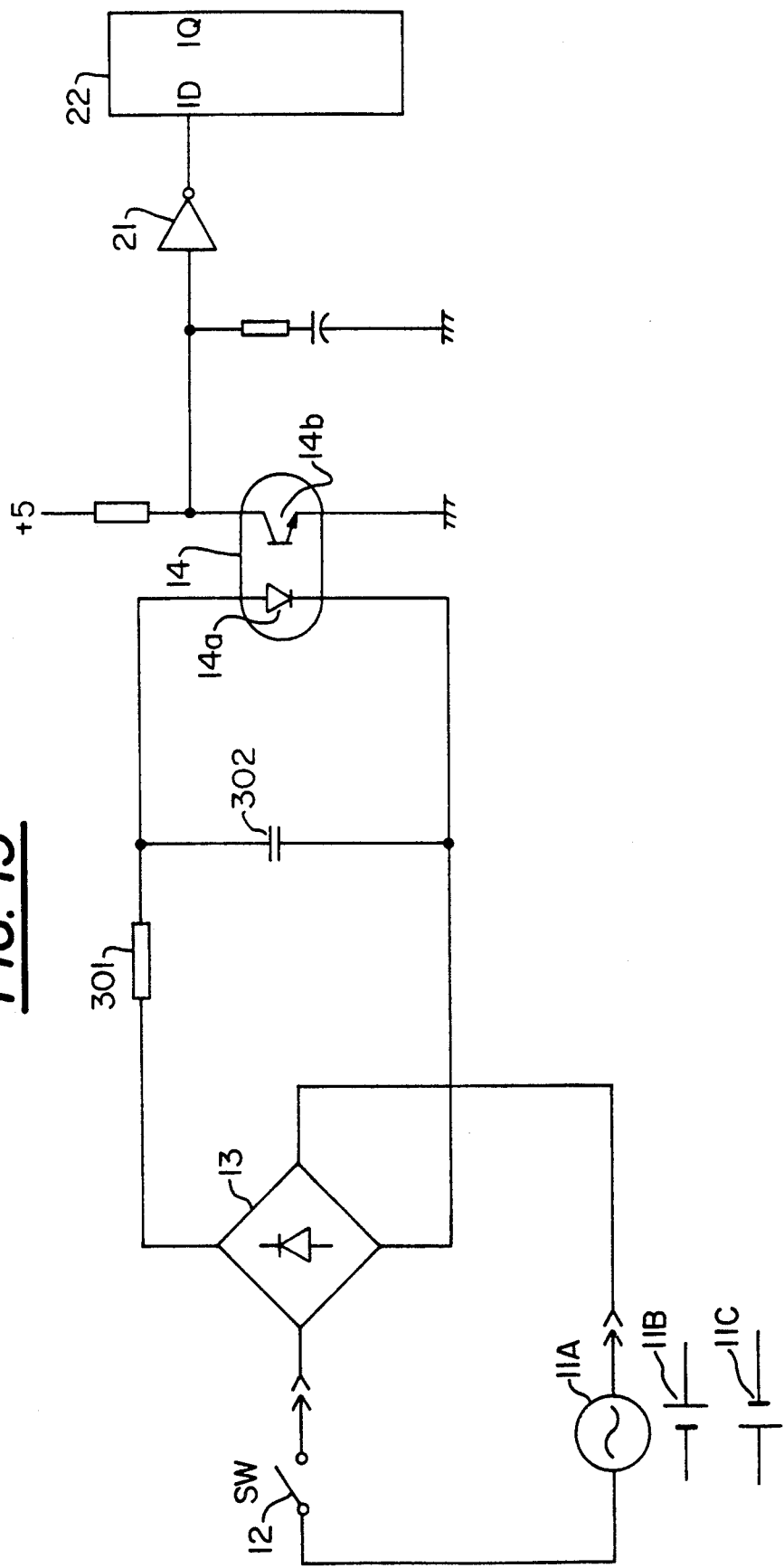
FIG. 13 is the seventh embodiment of the present invention, which is used in a narrow voltage range.

Furthermore, if the present invention would be used in not so wide voltage range, a current control circuit is not necessary. In such a case, a modified embodiment is used and it is the seventh embodiment of the present invention. The seventh embodiment is shown in FIG. 13.

The embodiment includes a filtering circuit and a photo-coupler circuit.

The filtering circuit filters ripple element in the electric current which is rectified by the rectification circuit.

The other elements in this embodiment are operated in the same manner as in other embodiments, so that detailed explanation is believed unnecessary.

As described above, according to the input module of the present invention, a mixed use of AC power source and DC power source for the input signal can be accomplished. Also, if DC power source is used as a power source for input signals, it can be used without consideration for its polarity. This realizes a general purpose input module.

Further, if the enable signal is used as an input control signal from the apparatus which the input signal is constructed for inputting binary information, overheating of circuit elements is prevented. This results in a reduction of electric power consumption.

Furthermore, if the synchronous circuit is used with the enable signal for AC power source, only valid signals could be input. This results a. stable input of input information.

In summary, this invention provides an input module having a general purpose usage.

What is claimed is:

1. An input module used in a control apparatus which uses an AC power source for inputting binary information from a switching means, comprising:
conduction means for bidirectionally conducting the binary information of the switching means, and including means for connecting a power source alternately, connectable to the AC power source;
constant current means, receiving an output from the conduction means, for supplying a constant current when the binary information is in a predetermined state;
an isolator, receiving the constant current from the constant current means, and outputting the binary information to the control apparatus; and
a synchronous circuit which compares a voltage of the power source with a voltage of said constant current means, and producing a signal change when the voltage of the power source exceeds, or becomes less than, said voltage of said constant current means, said signal used to synchronize with the power source to input the binary information stably; and
means, receiving said signal, for synchronizing the input of the binary information with said signal.

2. The input module of claim 1, wherein said constant current means includes
an NPN transistor; and
a PNP transistor connected in parallel to the NPN transistor.

3. The input module of claim 1, wherein said synchronous circuit includes:
a second constant current circuit for generating a first voltage value based on the power source;
a comparison circuit for comparing the first voltage value to a second voltage value provided by a second DC power supply and for outputting said signal which is representative of a desired synchronization of the binary information; and
said synchronizing means includes an enable circuit, connected to said constant current means, for selectively inputting the binary information based on said signal from said comparison circuit, said enable circuit allowing input of the binary information only when in an active state to thereby synchronize the binary information with said desired synchronization.

4. The input module of claim 3, wherein said enable circuit includes:
a multi-vibrator circuit, coupled to said comparison circuit, for generating at least one pulse during the time of which the binary signal corresponding to the output signal from the comparison circuit is input; and
an isolation circuit, connected to an output of said multi-vibrator circuit, for isolating electrically the binary information from an internal circuit of the control apparatus except during said time of said pulse.

5. An input module used in a control apparatus having both an AC power source and a DC power source for inputting binary information from a switching means, comprising:
bidirectional conduction and constant current means for bidirectionally conducting the binary information of the switching means, and for supplying a constant current when the binary information is in a predetermined state, including means for connecting a power source alternately, connectable to either of the AC power source or the DC power source, said bidirectional conduction and constant current means including: an NPN transistor for a PNP transistor connected in parallel at their emitters and collectors respectively and receiving said binary information, and at least one means for maintaining a constant voltage drop across a junction of one of said transistors; and an isolator, connected in series to said bidirectional conduction and constant current means, for outputting the binary information to the control apparatus, wherein said bidirectional conduction and constant current means also includes an enable signal circuit for controlling whether said constant current will be supplied.

6. An input module used in a control apparatus as in claim 5, wherein said enable circuit is connected in series in a voltage application path to bases of said transistors.

7. An input module as in claim 6, wherein said enable circuit includes at least one optical isolator, receiving said enable signal and producing a path between a base of one of said transistors and ground.

8. An input module as in claim 7, wherein said enable circuit controls a supply of power to light emitting diodes of said optical isolators.

* * * * *